United States Patent
Varma

(10) Patent No.: US 6,794,916 B1
(45) Date of Patent: Sep. 21, 2004

(54) DOUBLE EDGE-TRIGGERED FLIP-FLOPS

(75) Inventor: Pradeep Varma, New Delhi (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/449,791

(22) Filed: May 30, 2003

(51) Int. Cl.[7] .................. H03K 3/037; H03K 3/356
(52) U.S. Cl. ................ 327/218; 327/208; 327/210
(58) Field of Search .................. 327/199–203, 327/208–212, 218

(56) References Cited

U.S. PATENT DOCUMENTS

| | | | |
|---|---|---|---|
| 5,081,377 A | * 1/1992 | Freyman | 327/198 |
| 6,310,500 B1 | 10/2001 | Varma | 327/211 |
| 6,462,596 B1 | 10/2002 | Varma | 327/218 |

OTHER PUBLICATIONS

S.H. Unger, "Double Edge–triggered flip–flops", IEEE Trans. Computers. Jun. 1981, pp 447–451. vol. C–30, No. 6.
P. Varma and K.N. Ramganesh, "Skewing Clock to Decide Races—Double–edge–triggered Flip–flop", Electronics Letters, Dec. 6, 2001, pp 1506–1507, vol. 37, No. 25.
G.M. Blair, "Low–power Double–edge Triggered Flipflop", Electronics Letters, May 8, 1997, pp 845–847, vol. 33, No. 10.
Varma et al.,"A MOS Approach to CMOS DET FLip–Flop Design", IEEE Transactions, vol. 49, No. 7, Jul. 2002, pp. 1013–1016.

* cited by examiner

Primary Examiner—Tuan T. Lam
(74) Attorney, Agent, or Firm—McGinn & Gibb, PLLC; T. Rao Coca, Esq.

(57) ABSTRACT

A static, double-edged triggered flip-flop has an upper data path and a lower data path connected between a data input node and an output terminal. The upper path includes a switch connected to a first data loop, and the lower path includes a switch connected to a second data loop. The first and second data loop share a forward path having a data-inverting circuit and a feedback loop having a switch. In addition, each loop has a feedback path having a weak transistor. For the upper data path, the feedback transistor is operated on the basis of a skewed clock signal. For the lower data path the feedback transistor is operated on the basis of a complementary skewed clock signal. The use of clock skew and feedforward assist in race resolution. The use of extra resistance in the feedback transistor of the shared path similarly ensures that a race will be correctly resolved.

10 Claims, 10 Drawing Sheets

DOUBLE EDGE-TRIGGERED FLIP-FLOPS

FIELD OF THE INVENTION

The present invention relates to double edge-triggered flip-flops.

BACKGROUND

Flip-flops are a basic element of digital memory. To reduce the complexity of circuit to designs, a large proportion of digital circuits are synchronous in the sense that they operate using a clock. A flip-flop is one such circuit. Flip-flops typically latch data either on the rising or the falling edge of the clock cycle. This arrangement is inefficient as half of the clock edges are wasted, while the full implemental cost of the entire clock is borne.

In S. H. Unger, June 1981, "Double Edge-triggered Flip-flops", *IEEE Trans. Computers*, vol. C-30, no. 6, pp. 447–451, an attempt is proposed to overcome this above-mentioned inefficiency by using both the edges of the clock. The proposal is limited, however, by its complexity, which undercuts the gain made by the use of both clock edges. Still, this work prompted other attempts to simplify double edge-triggered (DET) flip-flops. As a general proposition, each of these attempts is responsible for reducing the overhead of DET flip-flops to more acceptable levels.

The use of weak transistors in feedback circuits of double-edge triggered flip-flop circuits is taught by G. M. Blair, "Low-power double-edge triggered flipflop", in *Electronics Letters*, 8 May 1997, Vol. 33, No. 10, pp 845–847.

U.S. Pat. No. 6,310,500, issued Oct. 30, 2001 to Varma, describes resolving race conflicts between input and output nodes of a loop circuit (for example, a latch), and especially one adapted for use in the flip-flop circuits of a digital memory. In summary, this publication describes using clock skew-based race resolution within loops/latches.

A closely related teaching is given in P. Varma and K. N. Ramganesh, "Skewing Clock to Decide Races—Double-edge-triggered Flip-flop", *Electronics Letters*, 6 Dec. 2001, Vol. 37, No. 25, pp 1506–1507.

U.S. Pat. No. 6,462,596, issued Oct. 8, 2002 to Varma, describes a static, double-edge triggered flip-flop having an upper data path and a lower data path connected between a data input node and an output terminal. The upper path includes a switch connected to a first data loop, and the lower path includes a switch connected to a second data loop. The first and second data loops share a forward path having a data-inverting circuit. In addition, each loop has a feedback path which contains only one element in the form of a switch.

Though various contributions have been made to the art of DET flip-flops, a need clearly exists for a design that still further improves the relative cost and performance of DET flip-flops.

SUMMARY

This need is achieved by a static, double-edge triggered flip-flop which has two bi-direction feedback paths connected from the output terminal to a respective intermediate node. One feedback path lies in a data path relating to the clock signal. The other feedback path lies in a data path relating to the complementary clock signal. The feedback paths each have a switch which operate on a skewed clock signal and complementary skewed clock signal, respectively.

The switches in the feedback paths can be weak transistors gated by the respective clock signals.

The DET flip-flop circuit designs disclosed herein use clock skew in parallel latches/loops, allowing inter-loop skew-driven interaction to improve the speed of race resolution for individual loops. Transistors are the only circuit elements used between an interconnection of input, clock, skewed clock, voltage supply, and output. Multiple loops, resolved individually by clock/phase skew, can assist each other's race resolution, by being organized in parallel and using bi-directional feedback paths.

The "nuisance value" of the initial period of a loop going out of phase, when a skewed phase feedback path is still active is turned into a beneficial advantage for inter-loop interaction. When multiple phase-skew-based loops share an output node then, as the phase shifts between the loops, the outgoing phase of one loop can benefit the incoming phase of another loop by biasing the shared output node in the direction of the incoming phase loop. Such a bias then assists the race resolution of the incoming phase loop.

Application of skew in flip-flop designs described herein yields an intra-loop power benefit in resolving races among the input/output nodes of the latches. Inter-loop interaction in the flip-flops arises when the trailing leg of the skewed clock in a "just disabled" latch leaves a still-enabled bi-directional feedback path touching the shared latch output.

This bi-directional path allows a temporary parallel data feedforward path to develop all the way from the flip-flop input to the shared output of the parallel latches comprising the flip-flops. This feedforward biases the shared output towards the voltage sought by a just enabled latch, which in turn speeds up the enabled latch's race settlement. Consequently, the operation of the flip-flop as a whole is improved.

The unshared paths in the outer loops are switched by the clock (or complementary clock), or skewed clock (or complementary, skewed clock). Accordingly, such a design is amenable to a low power implementation wherein the effect on power of threshold voltage drop due to an n-channel metal-oxide-semiconductor (NMOSFET, or NMOS) used as a pass transistor can be rectified by the pullup effect of a feedback p-channel MOS (PMOS) transistor.

The feedback paths of the outer loops use a skewed clock and extra resistance combination compared to the forward paths. High-speed, reduced-power operation across multiple voltages results is achieved, due to use of MOS-style clocked inverters, and the clock skew method of deciding races that also provides parallel feedforward.

MOSFETS can be used as the circuit elements. MOSFETS allow high-speed, reduced transistor, and low power complementary-symmetry MOS (CMOS) DET flip-flops, in which transistor gate area and switching capacitance is also reduced. Switching capacitance is proportional to the switched transistor gate area. Thus, when the switched gate area goes down, so does the capacitance.

Several designs are described in CMOS technology. CMOS flip-flops are widely used in building many systems including portable, handheld systems, personal computers, servers, etc. Thus reduced power and high-speed operation is possible. Cooling requirements are also reduced, battery life and device life are increased, and maintenance costs are reduced.

The DET flip-flop circuit designs described herein can be of mixed-mode circuit design. In a mixed-mode design, high-speed operations are delegated to the high-speed-oriented DET flip-flops described herein, enabling a reduction in clock speed. A mixture of SET and DET flip-flops can perform lower speed work. Clock speed requirements can be relaxed by using DET flip-flops to perform high-speed operations.

DETAILED DESCRIPTION

Switch Implementation

Figure 1:
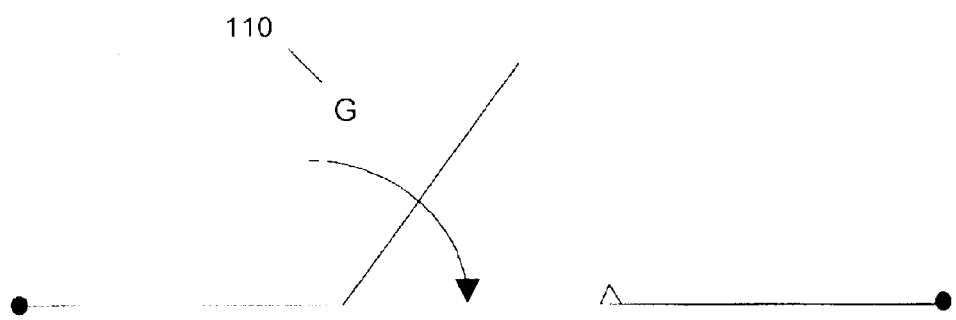
FIG. 1 is a schematic representation of a simple switch.
Figure 2A:
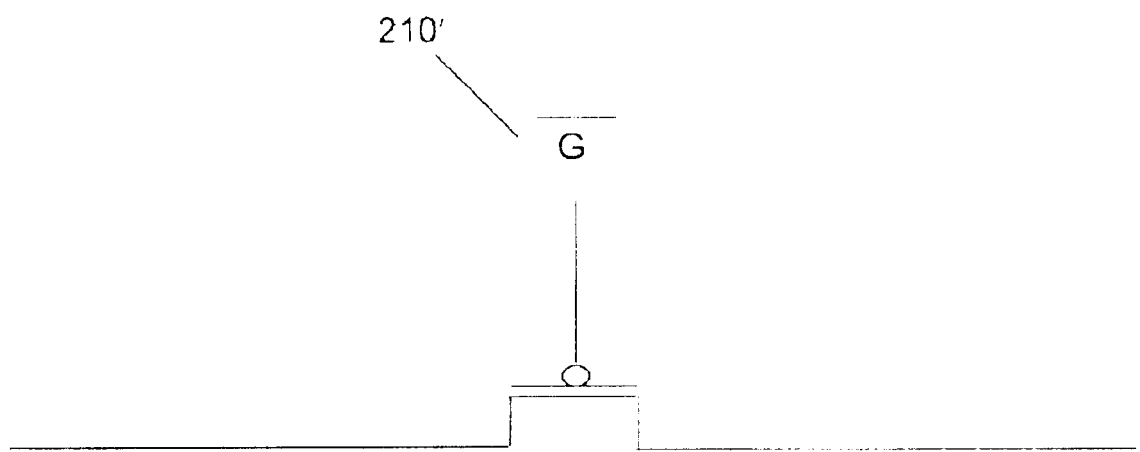
FIGS. 2A, 2B, and 2C are, respectively, schematic representations of the switch of FIG. 1 implemented using PMOS, NMOS, and CMOS technologies.
Figure 2B:
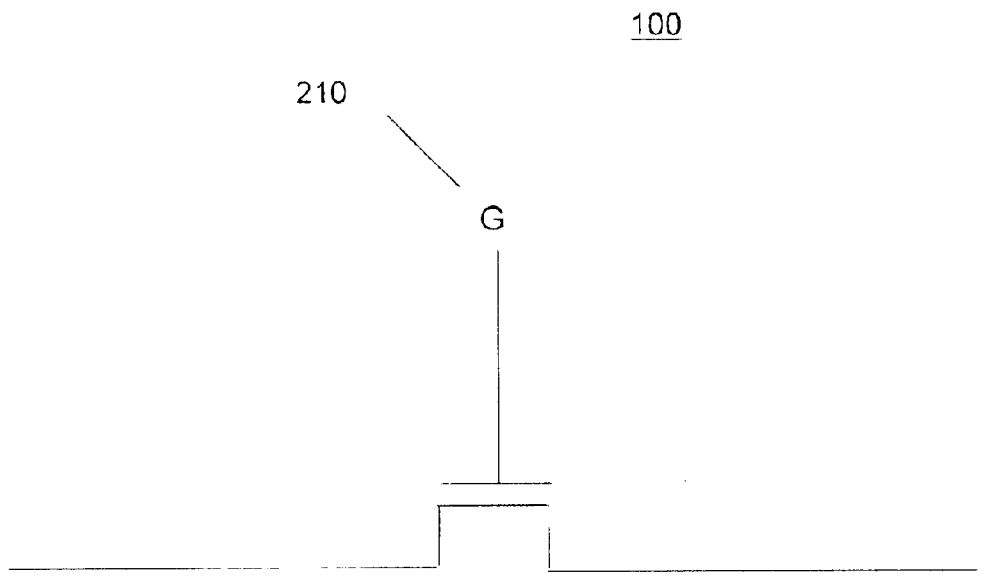
Figure 2C:
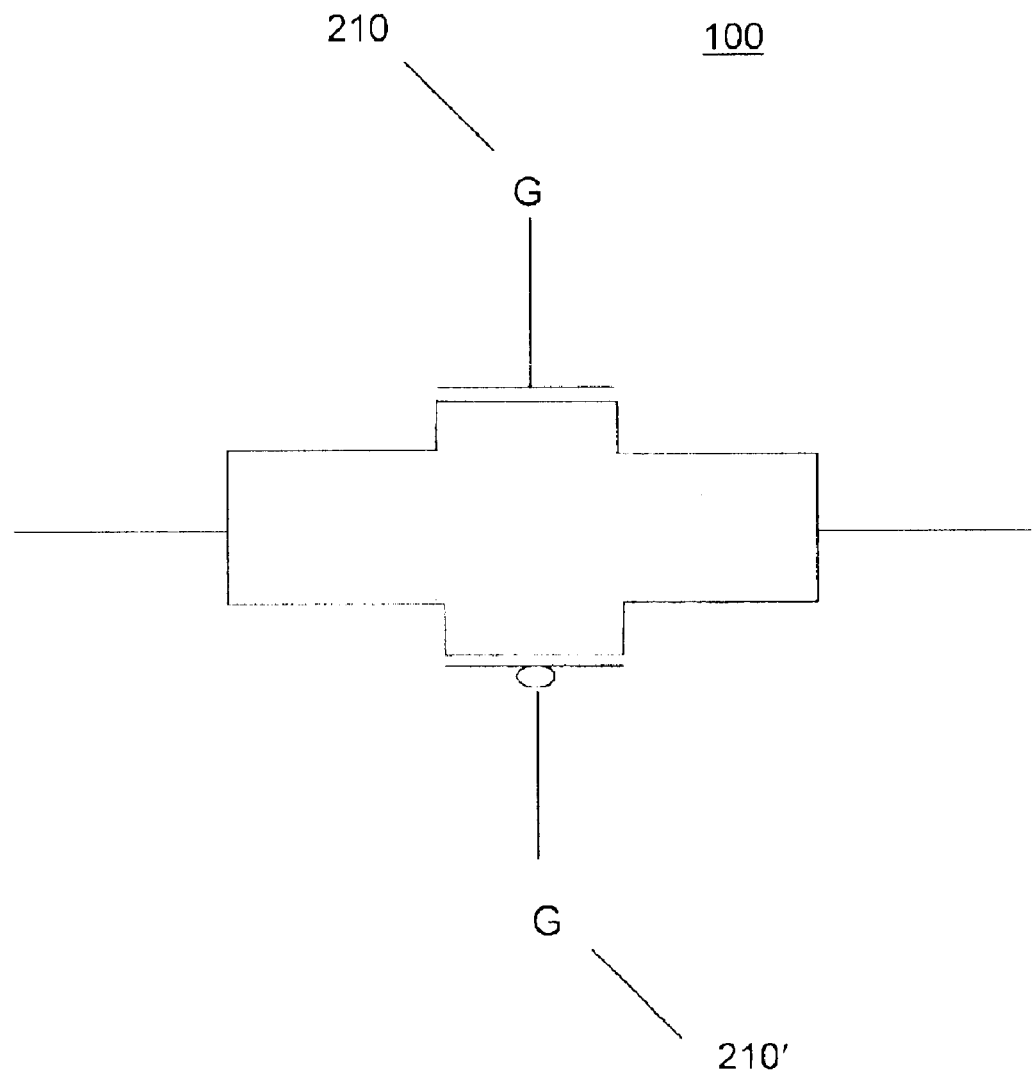

FIG. 1 represents a simple switch 100. This notional switch is depicted with logic input G 110. Common implementations of the switch 100 in PMOS (p-channel metal-oxide semiconductor), NMOS (n-channel metal-oxide semiconductor), and CMOS (complementary-symmetry metal-oxide semiconductor) are shown in FIGS. 2A, 2B, and 2C respectively. The switches are controlled by logic input G 210 or its complement $\overline{G}$ 210' Any of the switch implementations represented in FIGS. 2A to 2C can be used in the circuit design described below. Different switch implementations are appropriate under different circumstances.

Generating Clock Skew

Figure 3:
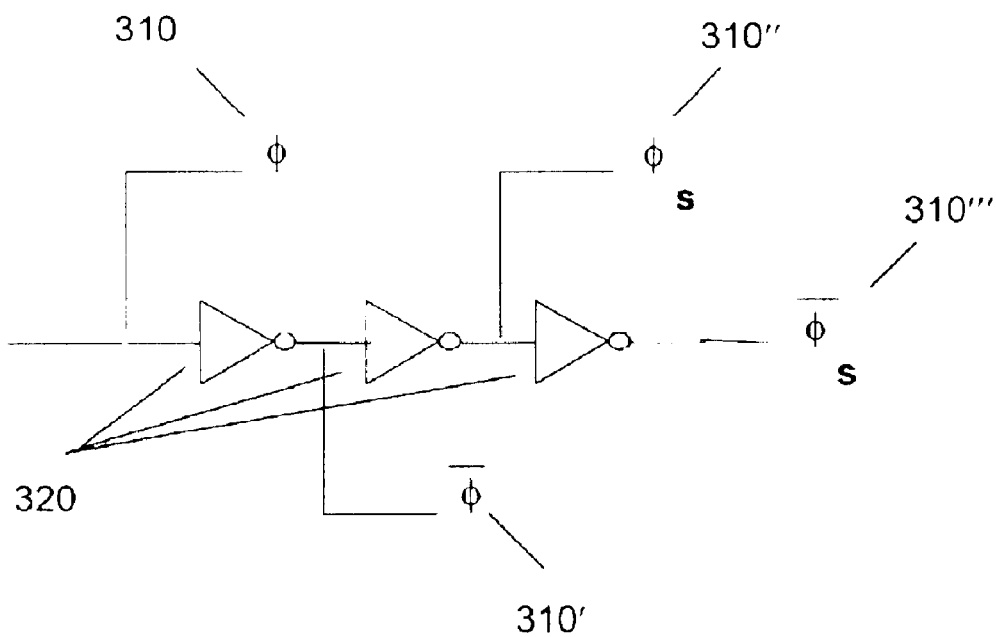
FIG. 3 is a schematic representation of a circuit for generating clock skew.

FIG. 3 shows a simple method of generating clock skew. A clock signal 310, Φ, and its complement 310', $\overline{\Phi}$, can be skewed (ie. clocked-edge delayed) by the device 300 represented in FIG. 3 by passing the signals through two inverters each. The three inverters 320 shown in FIG. 3 are shared for the purpose of locally complementing the clock, and also generating skew. The first inverter complements Φ, depicted as $\overline{\Phi}$ 310'. The second inverter yields a skewed Φ, depicted as $\Phi_s$ 310". The third inverter yields a skewed version of the complement of Φ ($\overline{\Phi}$ 310') depicted as $\overline{\Phi}_S$ 310'".

The mechanism represented in FIG. 3 for obtaining a locally-complemented clock and skewed clock lines can be used with the flip-flop circuit designs described herein. This mechanism can be "amortized" over multiple flip-flops to share the mechanism's design cost. In this analysis of flip-flops, all clock lines, including skewed clock and inverted clock, are assumed to be external. These externally provided lines can follow the design represented in FIG. 3. Alternatively, some other generation mechanism can be used.

Static Flip-flop Design

Figure 4A:
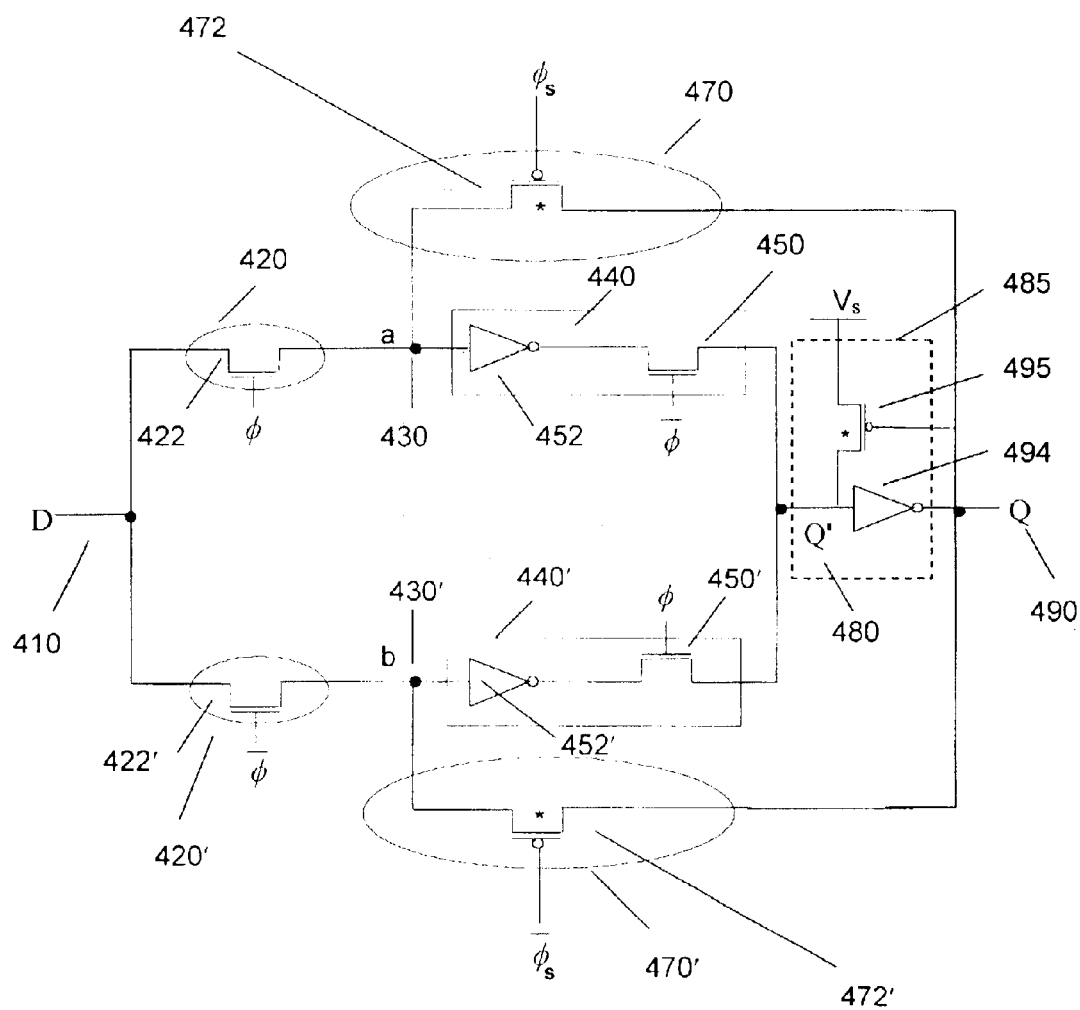
FIG. 4A is a schematic representation of a static DET flip-flop design of the present invention implemented in CMOS technology.

FIG. 4A shows a reduced-power DET flip-flop circuit design 400, implemented in CMOS technology. From node D 410 to nodes a and b, 430, 430' are input-facing switches implemented by NMOS pass transistors 422, 422' represented by the small dashed ovals 420 and 420'. Between nodes a and b and node Q'—the data paths—are respective series connected inverters 452, 452' and pass transistors 450, 450', represented within the dashed rectangular boxes 440, 440'.

The various switches in FIGS. 4A can have alternate implementations, as described above with reference to FIGS. 2A to 2C.

Two feedback branches 470 and 470' are represented in large dashed ovals. Each of the two feedback branches 470 and 470' is a weak switch, implemented as a PMOS pass transistor 472, 472' and switched by a respective skewed clock signal $\Phi_s'$, $\overline{\Phi}_S$. The feedback paths 470 and 470' in FIG. 4A are both resistive (weak), as indicated by the "*".

The design in FIG. 4A is "static" because in a clock phase, once the race between an intermediate node (a 430 or b 430') and Q 490 is decided, the node and Q 490 reinforce each other via the loop formed through the relevant forward path and feedback path. The logic at Q 490 can be sustained indefinitely in the case when the clock period is made large, or when the clock stops in any given phase.

The two data paths 440, 440' share a forward looping path 485. The forward portion of this shared looping path has an inverter 494 from Q' 480 to Q 490. The looping portion of this shared path is from Q 490 to Q' 480, and comprises a weak PMOS pullup transistor 495 connected to the supply voltage $V_s$. The "*" again indicates that the transistor is resistive or weak. The motivation for having a pullup PMOS transistor 495 is to overcome $V_t$ drop-related power losses associated with the NMOS pass transistors 450, 450' feeding the inverter 494.

Rationale for Clock Skewing and Inter-loop Skew Benefit

The outer loops 470, 470' in FIG. 4A are designed to be individually amenable to resolution by a clock skew method. Furthermore, they enable an inter-loop interaction that speeds them up individually, and the flip-flop as a whole. In broad terms, this inter-loop benefit is achieved by (a) building the feedback branch of each skew-resolved loop in a bi-directional manner, (b) making the output node of all skew-resolved loops a common shared node, (c) ensuring that one and only one of the skew-resolved loops is in phase at a time, and (d) ensuring that the input node of a loop with outgoing phase has a voltage bias similar to the input node of the incoming phase loop.

In terms of FIG. 4A, this is obtained by (a) keeping the feedback branches of the outer loops 470, 470' bi-directional using only one (bi-directional) pass transistor 472, 472' in each feedback branch, (b) making Q 490 the common output node of all skew-resolved (outer) loops, (c) having only two skew resolved loops wherein one (470') is in phase at the high level of the clock and the other one (470) is in phase at the low level of the clock, and (d) ensuring that the input nodes (a 430, b 430') of the two skew-resolved loops have a similar bias around a change of phase by having them be set/driven by the same source, D 410, at the time near the change of phase of clock (since the input of a flip-flop is generally designed to be stable/unchanging near a triggering clock edge, the two input nodes have a similar voltage bias).

To aid understanding of the operation of the flip-flop circuit of FIG. 4A, let us begin with a discussion that omits clock skew. In this case of zero skew (i.e., clock and clock complement are used directly, in place of skewed clock and skewed clock complement, respectively), consider the half clock period after a falling clock edge. The edge latches node D 410 at node a 430, following which the following race occurs in the initial part of the half period when the clock is low. The (previously) existing voltage at node Q tries to change node a 430 to itself via the feedback path 470 and node a 430 tries to change Q 490 to itself via the forward path 440.

If the previously existing voltage at Q 490 and the voltage latched at node a 430 are the same, then clearly there is no contest between the nodes. However, if the voltages are at different levels then the race needs to be decided in a manner that yields correct behaviour of the circuit. For this purpose the feedback path 470 is chosen to be resistive relative to the forward path 440 so that the forward path always wins the race. The race, in this case, is in addition to any contest due to the weak pullup feedback from Q 490 to Q' 480. Both these races/contests have to be resolved in favor of the latched voltage at node a 430 by weaknesses in the feedback paths. The same is the case for the feedback path 470' and the forward path 440' in the rising-edge latching, lower portion of the circuit of FIG. 4A.

Instead of building only a large resistance in the feedback path from Q 490 to node a 430, turning ON the feedback path is desirably delayed for long enough to ensure that the forward path gets time enough for the logic at node a 430 to reach out and set Q 490 before the feedback begins. This delay is obtained by applying the skewed clock signal $\Phi_s$, $\overline{\Phi}_s$ to the feedback path switch 472, 472'. The use of skew in deciding races between input/output nodes of a latch has the benefit of reducing decision time (higher speed ensues), and power loss by the contesting paths of a loop. Furthermore, by using skew to decide the race, the need for a large, weak transistor for the same purpose is ameliorated, providing flexibility in the sizing of transistors (for example, for minimizing area).

Figure 4B:
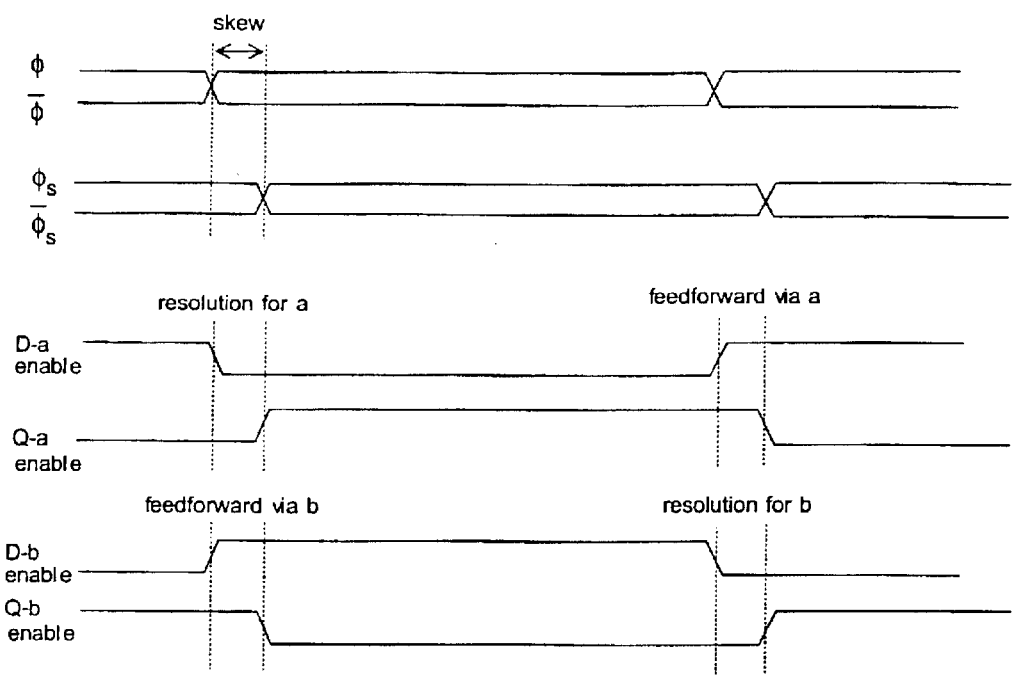
FIG. 4B is a timing diagram for circuit processes of the design of FIG. 4A.

FIG. 4B illustrates the timing relationship among various circuit processes induced by clock skew. In the timing diagram, clock and clock complement, $\Phi$, $\overline{\Phi}$ are shown overlapping and the skewed clock and skewed clock complement $\Phi_s$, $\overline{\Phi}_s$ are shown similarly. The path from node D 410 to node a 430 is enabled when $\phi$ is high (shown as D-a enable). The feedback path from Q 490 to node a 430 is enabled when the skewed clock is low, or in other words, the complement of the skewed clock is high. Race resolution between node a 430 and Q 490 occurs in the skew window between when D-a enable goes low (with the input getting latched at node a 410 by the falling clock edge) and before Q-a enable occurs. After a 430 has latched an input value, the skew period illustrated allows it to straightforwardly set the value at Q 490 before Q 490 gets a chance to get back to a 430. A similar behaviour is observed at the rising edge of the clock $\phi$, at which time the race resolution of b 430' transpires. Each of these race resolutions is also assisted by coinciding feedforward processes shown in FIG. 4B. These feedforward processes exist in parallel with normal, intra-loop skew-based resolution of individual loops of FIG. 4A. Thus feedforward via node b 430' occurs in parallel with and assists the resolution of node a's loop, and feedforward via node a 430 exists in parallel with and assists the resolution of node b's loop as shown in FIG. 4B.

Consider now the case when the latch 450 goes out of phase following a clock edge. The feedback path 470 continues to be active for a time equal to the clock skew (the feedback path starts late and ends late compared to clock due to skew). In this short duration, the input D 410 gets a new, temporary, parallel feedforward path to Q 490 via node a 430, since the pass transistor 422 has just turned ON.

Meanwhile, the latch 450' is enabled and tries to set the output node Q 490 via its forward path. The parallel feedforward from D 410 to Q 490 assists this process so long as D 410 holds the same value as the D 410 value just latched at node b 430'. This is commonly true, since flip-flop inputs are designed to be stable around a clock edge. There is, however, no need to mandate that the hold time for the D 410 input be equal to clock skew, since the inverter 494 is set by the forward path from node b 430' within skew time; that is, before the feedforward from node a 430 ends. While feedforward can contest the value at Q 490 during its life, post feedforward, the inverter 452' (in the forward path 440) is free to set the value of Q 490 while feedforward turns off and feedback to node b 430' turns on. Thus the feedforward path from a 430 can at most assist the setting of Q 490 to the value latched at b 430', which is also the general scenario given the common D 410 stability around clock edges. Thus feedforward generally speeds up the settling of output Q 490 to the voltage latched at a clock edge.

In the feedforward context, skew time should be kept close to the minimum necessary (that is, the propagation delay of the forward paths from a/b to Q 490). The clock skew time also provides an upper bound to the duration in which D 410 and Q can contest each other via the feedforward. This, in turn, bounds the power cost of the process. By bounding the skew time as a constant (similar to the propagation delay of the forward path from node b/a to Q), the power cost of feedforward is converted into an ordinary, static, switching cost.

To contain this power cost further, and to bound the adverse influence of Q 490 upon the logic-level at D 410 (and vice-versa in the uncommon case when D 410 is unstable right after a clock edge), extra resistance is used in the feedback path from Q 490 to a/b. This also reduces the fanout load placed on Q 490 for driving internal flip-flop nodes (a/b), which in turn speeds up the setting of Q 490. Since the feedback path in the preferred embodiment is switched by a PMOS pass transistor, the lower mobility of PMOS carriers provides extra resistance without cost.

In the general case of designing parallel feedforward assistance for race resolution in loops via skew, it is not necessary for the parallel loops to be rooted in the same input node, like D 410 in FIG. 4A. All that is needed is that the input nodes of the individual loops be charged such that the input node of a loop with outgoing phase have the same voltage bias as the input node of a loop with incoming phase. It is at the circuit designer's discretion to choose appropriate feeds for individual loops' input nodes to achieve this purpose.

Weak Transistors

The weak transistors 472, 472', 495, in FIG. 4A can be obtained by exchanging the width and length dimensions of a normal, minimum-area PMOS transistor. For a W/L ratio of 2.5 for a normal minimum-area transistor, the W/L of a weak transistor becomes 1/2.5, which provides a weakness factor of 2.5×2.5=6.25 compared to the normal PMOS transistor. For a mobility factor of about 3, a cumulative conductivity reduction factor of 3×6.25=~20 is obtained compared to a normal NMOS transistor, which is more than adequate in most cases. As a benefit, the area of the weak transistor continues to remain the same as the area of a normal minimum-area transistor. If more resistance is required, then a larger, more resistive PMOS pull-up or a series combination of a switched and unswitched PMOS can to be used, as is well known in the prior art.

Pullup Benefit of PMOS Feedback

A CMOS inverter has a benefit in consuming (virtually) no static power when its input is at either logical voltage extreme—logic 0, or logic 1. For intermediate voltages, however, the CMOS inverter can have both its NMOS and PMOS transistors partially on, resulting in significant power consumption.

The NMOS pass transistors (switches) shown in FIGS. 4A. (and also FIG. 4C) cause a threshold voltage drop ($V_t$ drop) on a high voltage transmitted through them. The result of this is that when the output of such a pass transistor drives an inverter ahead of the transistor, the inverter consumes extra power since the inverter is driven by a somewhat intermediate voltage, and not a clean, extreme, logic 1 voltage.

Being PMOS pass-based, all the weak feedback branches in FIG. 4A (transistors 472, 472', 495) tend to ameliorate the threshold voltage drop on high voltages that exist on the outputs of the feedback branches due to NMOS pass transistors. This is because the PMOS pass allows a full excursion to a clean logic 1 voltage and the feedback makes up for the loss caused by the NMOS pass transistor. Improved logic excursion next improves the power consumption of the succeeding inverter and the flip flop overall.

The use of weak transistors built by flipped ratio transistors, and extensive use of pass transistors for feedback, switches and also for pullup purposes (to overcome $V_t$ drop) leads to a reduced number of transistors needed to be used to realise a DET flip-flop circuit. The ability to work with a small number/minimum area transistors offers many benefits including higher speeds, lower power consumption, reduced area and reduced switching capacitance.

Alternative Implementations

Figure 5:
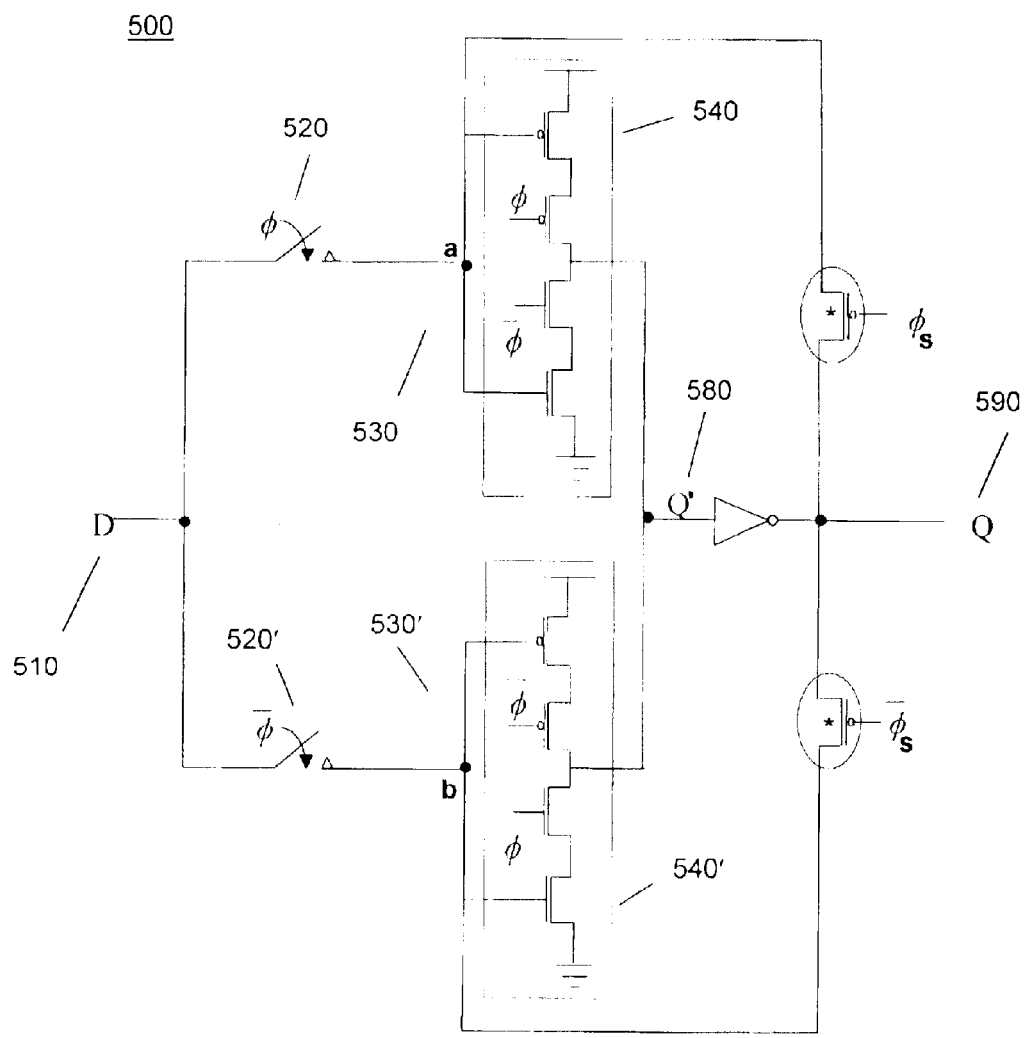
FIG. 5 is a schematic representation of an alternative implementation of the design represented in FIG. 4A.

FIG. 5 derives a static flip-flop 500 from the design in FIG. 4A by substituting the series inverter/pass transistor combination 440, 440' with well-known 4-transistor CMOS clocked phase inverters 540, 540'. Since the clocked inverter circuit 540, 540' is a one-stage circuit compared to the two-staged series combination in FIG. 4A, the speed of the flip-flop 500 in FIG. 5 is higher.

The speed of the FIG. 5 design is also higher because the output of the clocked inverter in FIG. 5 has full logic excursion without any $V_t$ drops, thus, in distinction with FIG. 4A, the need for pullup feedback from Q 590 to Q' 580 is eliminated.

The switch 520, 520' implementations can be any of those shown in FIGS. 2A to 2C, although NMOS pass transistors are preferred for a reduced transistor implementation. In this case the number of transistors used in FIG. 5A is fourteen.

Alternative Clocked Inverters

Figure 6:
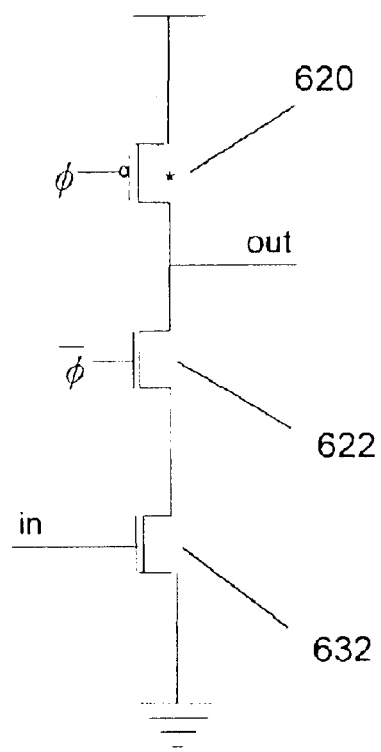
FIG. 6 is a schematic representation of a clocked inverter circuit usable as an alternative implementation to those given in FIG. 5.

A further reduction of transistors in FIG. 5 is possible by replacing the clocked inverter circuits 540, 540' with the 3-transistor MOS-style clocked inverter arrangement 600 shown in FIG. 6. This reduces the static flip-flop's transistor count down to 12. Another motivation for using MOS-style clocked inverters is their suitability to reduced voltage operation.

This inverter arrangement 600 uses a clock-switched PMOS transistor 620 for two functions. The first is common to the standard clocked inverter 540—enabling/disabling the inverter depending upon clock phase. She second function is to use the clock-switched PMOS 620 as a load transistor for the data-switched NMOS transistor 632, as in a standard NMOS-style inverter. The clock complement-switched transistor 622 performs the same function as in the arrangement of FIG. 5. Since the resistance of the load transistor in an NMOS inverter is required to be much more than the drive transistor, the clock-switched PMOS 620 in the alternative inverter of FIG. 6 is required to be highly resistive compared to the series combination of NMOSs 622 and 632. A resistance factor of ~20 as obtained by flipping PMOS width/length ratios as discussed previously is more than adequate for meeting the requirements in the general case. Thus the alternative clocked inverter 600 obtains the functionality of a standard clocked inverter 460, 540 using just three minimum-area transistors.

Mixed-mode Design

Figure 7:
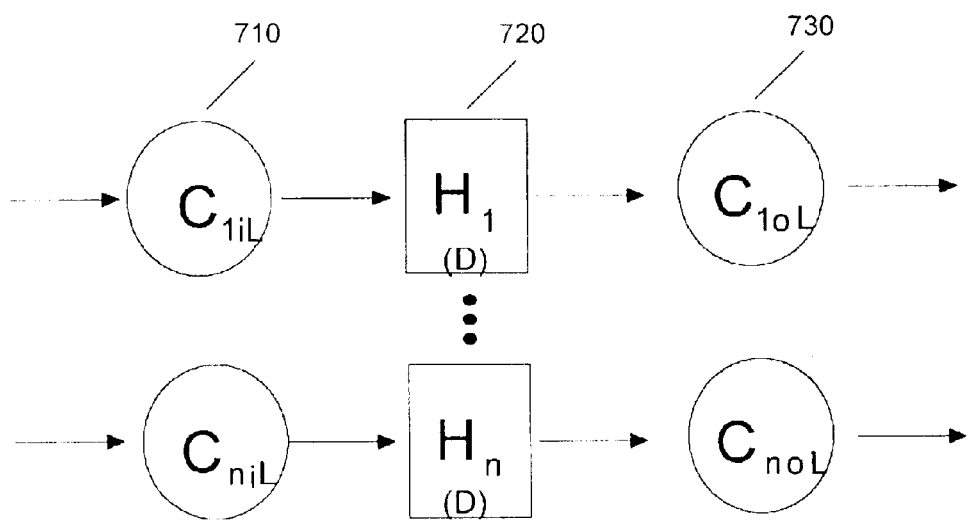
FIG. 7 is a representation of a general schema for designing large circuits using a combination of SET and DET flip-flops.
Figure 7:
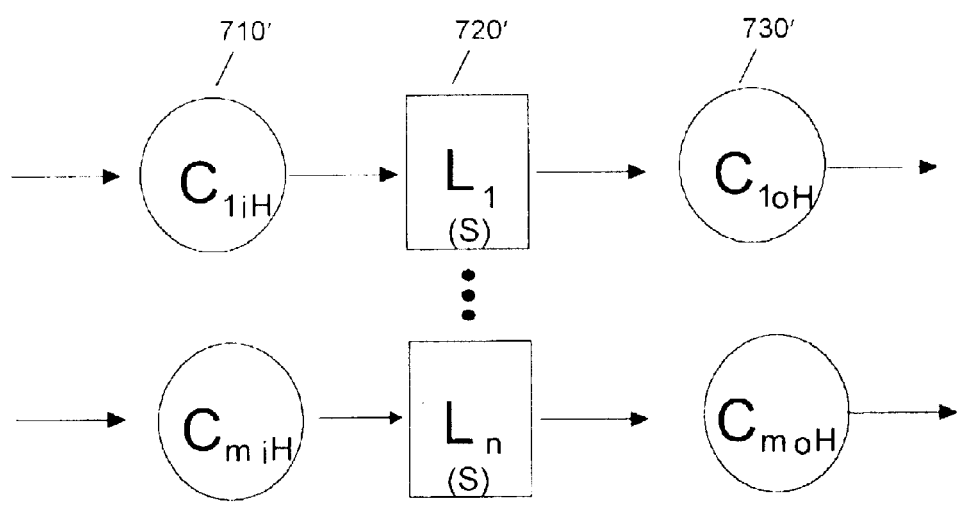

FIG. 7 shows a general schema 700 of designing large circuits using a combination of SET and DET flip-flops. Blocks labelled H (720) in the FIG. 7 represent synchronous storage areas with high throughput requirements, while blocks labelled L (720') represent synchronous storage areas with low throughput requirements. Ovals labelled C represent combinational circuitry at the input 710, 710' and output 730, 730' of synchronous storage.

The input ovals are subscripted explicitly with i and output ovals are subscripted with o. A total of n high-speed storage areas with associated combinational circuitry are shown along with m low-speed storage areas. Any kind of interconnect between the storage areas is allowed (from the output combinational circuitry of one area to input combinational circuitry of another). This includes feedback loops for one area or multiple areas. Input and output to the entire circuit is not shown explicitly.

In effect, some storage areas can be considered to represent the input and output function—input lines can be considered as a notional storage area with null combinational circuitry and no interconnect from other areas to its input. Output lines can be considered as a notional storage area with null combinational circuitry, with interconnect coming to its input from other areas, but no interconnect from its output to other areas. Given such a representation of a large digital circuit, an efficient implementation of the circuit can be carried out by implementing the high-speed areas using double edge-triggered flip-flops is in accordance with any one of the embodiments taught herein, and indicated by "(D)" in FIG. 7. The low-speed areas can be implemented using suitable single edge-triggered flip-flops as indicated by "(S)".

In a simple scenario, the high-speed areas are just twice as fast as the low-speed areas and hence one clock speed with the mapping to DETs and SETs above can yield the required functionality. In this case, the timing relationship between storage areas and combinational circuitry must be maintained. For connection between the output of some $H_x$ and input of some $L_y$, this means the following inequality must hold (assuming a symmetric clock, which is preferred):

$$\text{Propagation Delay}(H_x) + \text{Delay } (C_{xoH}) + \text{Delay}(C_{yi}) + \text{Setup Time}(L_y)$$
$$< \text{Clock Period}/2 \quad [1]$$

In the above inequality of Equation [1], half of the clock period is needed on the right hand side because in a DET implementation of $H_x$ and SET implementation of $L_y$, output of $H_x$ just one edge before the triggering edge of $L_y$ can be used regardless of whether the SET triggering edge is rising or falling. The timing relation for a connection from a low-speed area to a high-speed area is similar, since again the triggering edge of the high-speed DET area is a half-clock period away from the triggering edge of the SET low-speed area.

In a more complex scenario, different throughput rates can be required among the various H and L blocks. For a given system clock speed, H blocks with twice the throughput (bit rate) as clock speed can be implemented straightforwardly using DET flip-flops. For higher speed H blocks, local clock multiplication is required. In a preferred scenario, this would be minimized with an attempt made to contain the system clock to within half the throughput of the maximum speed areas, thereby allowing a DET implementation of the high-speed areas.

Having chosen such a system clock speed, slower speed blocks can be implemented as either SET or DET flip-flops with combinational circuitry determining the clock input to the flip-flops also, which allows the combinational circuitry to have the power of slowing down the clock trigger as much as needed for the slower blocks. In any case, timing relations similar to above need to be satisfied.

Conclusion

Double edge-triggered flipflops, according to the designs described herein, have particular advantages compared with existing flip-flop designs. Various alterations and modifications can be made to the techniques and arrangements described herein, as would be apparent to one skilled in the relevant art.

I claim:

1. A static, double-edged triggered flip-flop comprising:
   an input terminal;
   an output terminal;
   a first switch passing data from the input terminal to a first intermediate node on a clock signal;
   a first data loop connected between said first intermediate node and said output terminal, wherein said first data loop includes:
      (a) a first forward path having a circuit which operates based on a complementary clock signal;
      (b) a shared path connected from an output of said first forward path to said output terminal; and
      (c) a first bi-directional feedback path connected from said output terminal to said first intermediate node and having a third switch which operates on a skewed clock signal;
   a second switch passing data from the input terminal to a second intermediate node on said complementary clock signal; and
   a second data loop connected between said second intermediate node and said output terminal, wherein said second data loop includes:
      (a) a second forward path having a circuit which operates based on said clock signal;
      (b) said shared path also connected an output of said second forward path; and
      (c) a second bi-directional feedback path connected from said output terminal to said second intermediate node and having a fourth switch which operates on a complementary skewed clock signal.

2. The flip-flop of claim 1, wherein said clock signal and said complementary clock signal are different phases of a same clock signal output from a single clock circuit so as to be change phase coincidentally.

3. The flip-flop of claim 2, wherein said skewed clock signal and said complementary skewed clock signal are generated by said clock circuit to be delayed with respect to said clock signal and said complementary clock signal, respectively.

4. The flip-flop of claim 1, wherein said shared path between said first and second forward path outputs and said output terminal includes a forward inverter and a weak feedback transistor.

5. The flip-flop of claim 4, wherein said weak feedback transistor is a PMOS type.

6. The flip-flop of claim 1, wherein said third switch and said fourth switch are weak transistors.

7. The flip-flop of claim 6, wherein said weak feedback transistors are a PMOS type.

8. The flip-flop of claim 1, wherein the first forward and second forward path circuits consist of a series connected inverter and switch, said switches being operated by said complementary clock signal and said clock signal respectively.

9. The flip-flop of claim 1, wherein said first switch and said second switch are implemented using NMOS type transistors.

10. A digital synchronous circuit comprising:
   a plurality of single edge-triggered flip-flops having first input and output combinatorial circuits therefor; and a plurality of double edge-triggered flip-flops having second input and output combinatorial circuits therefor; and
   wherein each said double edge-triggered flip-flop comprises:
   an input terminal;
   an output terminal;
   a first switch passing data from the input terminal to a first intermediate node on a clock signal;
   a first data loop connected between said first intermediate node and said output terminal, wherein said first data loop includes:
      (a) a first forward path having a circuit which operates based on a complementary clock signal;
      (b) a shared path connected from an output of said first forward path to said output terminal; and
      (c) a first bi-directional feedback path connected from said output terminal to said first intermediate node and having a third switch which operates on a skewed clock signal;
   a second switch passing data from the input terminal to a second intermediate node on said complementary clock signal; and
   a second data loop connected between said second intermediate node and said output terminal, wherein said second data loop includes;
      (a) a second forward path having a circuit which operates based on said clock signal;
      (b) said shared path also connected an output of said second forward path; and
      (c) a second bi-directional feedback path connected from said output is terminal to said second intermediate node and having a fourth switch which operates on a complementary skewed clock signal.

* * * * *